United States Patent
Gomes et al.

(12) 
(10) Patent No.: US 6,668,331 B1
(45) Date of Patent: Dec. 23, 2003

(54) APPARATUS AND METHOD FOR SUCCESSIVELY GENERATING AN EVENT TO ESTABLISH A TOTAL DELAY TIME THAT IS GREATER THAN CAN BE EXPRESSED BY SPECIFIED DATA BITS IN AN EVENT MEMORY

(75) Inventors: Glen A. Gomes, Santa Clara, CA (US); Anthony Le, Santa Clara, CA (US); James Alan Turnquist, Santa Clara, CA (US); Rochit Rajusman, Santa Clara, CA (US); Shigeru Sugamori, Santa Clara, CA (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/535,031

(22) Filed: Mar. 24, 2000

(51) Int. Cl.$^7$ ............................. G06F 1/04; G06F 1/12
(52) U.S. Cl. ..................... 713/401; 713/400; 713/500; 713/502; 714/715
(58) Field of Search ................................ 713/400, 401, 713/500, 502; 702/79, 89; 714/715

(56) References Cited

U.S. PATENT DOCUMENTS

| | | | | |
|---|---|---|---|---|
| 4,744,281 A | * | 5/1988 | Isozaki ........................ 84/602 |
| 5,546,037 A | * | 8/1996 | Kenny et al. ................ 327/230 |
| 5,845,109 A | * | 12/1998 | Suzuki et al. ................ 713/401 |
| 5,958,044 A | * | 9/1999 | Brown et al. ................ 712/219 |
| 6,351,822 B1 | * | 2/2002 | Wright et al. ................... 714/8 |

FOREIGN PATENT DOCUMENTS

JP  06090148 A  *  3/1994  .......... H03K/5/135

OTHER PUBLICATIONS

Moyer, G.C.; Clements, M.; Lui, W.; Schaffer, T.; Cavin, R.K., III.; "The delay vernier pattern generation technique", Solid–State Circuits, IEEE Journal of, vol.: 32 Issue: 4, Apr. 1997. pp. 551–562.*

* cited by examiner

Primary Examiner—Thomas Lee
Assistant Examiner—James K. Trujillo
(74) Attorney, Agent, or Firm—Muramatsu & Associates

(57) ABSTRACT

An apparatus and method in an event based test system for testing an electronics device under test (DUT). The apparatus includes an event memory for storing timing data and event type data of each event wherein the timing data of a current event is expressed by a delay time from an event immediately prior thereto with use of a specified number of data bits, and an additional delay time inserted in the timing data of a specified event in such a way to establish a total delay time of the current event which is longer than that can be expressed by the specified number of data bits in the event memory. The additional delay time is inserted by replicating the timing data and the event type data of the event immediately prior to the specified event.

8 Claims, 11 Drawing Sheets

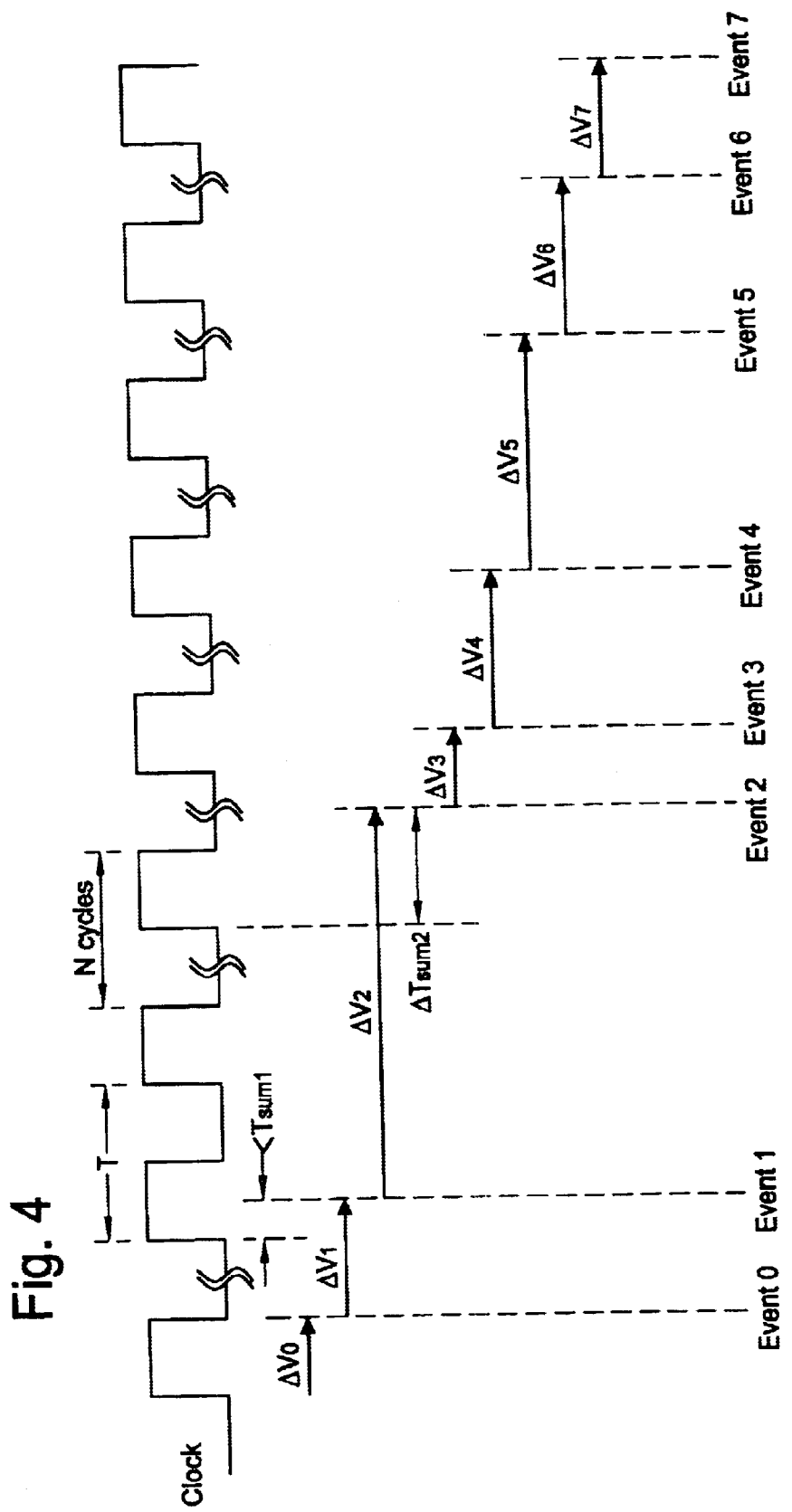

Fig. 5

| Event | Delay | Delay Count | Delay Vernier | Event Type |
|---|---|---|---|---|
| 0 | $\Delta V_0$ | C0 | V0 | Drive Logical Low |
| 1 | $\Delta V_1$ | C1 | V1 | Drive Logical High |
| 2 | $\Delta V_2$ | C2 | V2 | Drive Logical Low |
| 3 | $\Delta V_3$ | C3 | V3 | Drive Logical High |
| 4 | $\Delta V_4$ | C4 | V4 | Drive Logical Low |
| 5 | $\Delta V_5$ | C5 | V5 | Drive Logical High |
| 6 | $\Delta V_6$ | C6 | V6 | Drive Logical Low |
| 7 | $\Delta V_7$ | C7 | V7 | Drive Logical High |

Fig. 8

| Event | Delay | Delay Count | Delay Vernier | Event Type |
|---|---|---|---|---|
| 0 | $\Delta V_0$ | C0 | V0 | Drive Logical Low |
| 1 | $\Delta V_1$ | C1 | V1 | Drive Logical High |
| 2a | $\Delta V_{2a}$ | Maximum | 0 | Drive Logical High |
| 2b | $\Delta V_{2b}$ | C2 | V2 | Drive Logical Low |
| 3 | $\Delta V_3$ | C3 | V3 | Drive Logical High |
| 4 | $\Delta V_4$ | C4 | V4 | Drive Logical Low |
| 5 | $\Delta V_5$ | C5 | V5 | Drive Logical High |

Fig. 10

| Event | Delay | Delay Count | Delay Vernier | Event Type |
|---|---|---|---|---|
| 0 | $\Delta V_0$ | C0 | V0 | Drive Logical Low |
| 1 | $\Delta V_1$ | C1 | V1 | Drive Logical High |
| 2a | $\Delta V_{2a}$ | Maximum | 0 | NOP |
| 2b | $\Delta V_{2b}$ | C2 | V2 | Drive Logical Low |
| 3 | $\Delta V_3$ | C3 | V3 | Drive Logical High |
| 4 | $\Delta V_4$ | C4 | V4 | Drive Logical Low |
| 5 | $\Delta V_5$ | C5 | V5 | Drive Logical High |

APPARATUS AND METHOD FOR SUCCESSIVELY GENERATING AN EVENT TO ESTABLISH A TOTAL DELAY TIME THAT IS GREATER THAN CAN BE EXPRESSED BY SPECIFIED DATA BITS IN AN EVENT MEMORY

FIELD OF THE INVENTION

This invention relates to an event based semiconductor test system for testing semiconductor devices, and more particularly, to a method and apparatus for generating test patterns and strobe signals based on event data in which a delay time can be easily inserted in event data of a specific event without affecting the other events.

BACKGROUND OF THE INVENTION

In testing semiconductor devices such as ICs and LSIs by a semiconductor test system, such as an IC tester, a semiconductor IC device to be tested is provided with test signals or test patterns produced by an IC tester at its appropriate pins at predetermined test timings. The IC tester receives output signals from the IC device under test in response to the test signals. The output signals are strobed or sampled by strobe signals with predetermined timings to be compared with expected data to determine whether the IC device functions correctly.

Traditionally, timings of the test signals and strobe signals are defined relative to a tester rate or a tester cycle of the semiconductor test system. Such a test system is sometimes called a cycle based test system. Another type of test system is called an event based test system wherein the desired test signals and strobe signals are produced by event data from an event memory directly on a per pin basis. The present invention is directed to such an event based semiconductor test system.

In an event based test system, notion of events are employed, which are any changes of the logic state in signals to be used for testing a semiconductor device under test. For example, such changes are rising and falling edges of test signals or timing edges of strobe signals. The timings of the events are defined with respect to a time length from a reference time point. Typically, such a reference time point is a timing of the previous event. Alternatively, such a reference time point is a fixed start time common to all of the events.

In an event based test system, since the timing data in a timing memory (event memory) does not need to include complicated information regarding waveform, vector, delay and etc. at each and every test cycle, the description of the timing data can be dramatically simplified. In the event based test system, as noted above, typically, the timing (event) data for each event stored in an event memory is expressed by a time difference between the current event and the last event. Since such a time difference between the adjacent events (delta time) is small, unlike a time difference from a fixed start point (absolute time), a size of the data in the memory can also be small, resulting in the reduction of the memory capacity.

For producing high resolution timings, the time length (delay value) between the events is defined by a combination of an integer multiple of a reference clock cycle (integer part or event count) and a fraction of the reference clock cycle (fractional part or event vernier). A timing relationship between the event count and the event vernier is shown in timing charts of FIGS. 3A–3E. In this example, a reference clock (master clock or system clock) of FIG. 3A has a clock cycle (hereafter also referred to as "period" or "time interval") T. Event 0, Event 1 and Event 2 are related in timings as shown in FIG. 3C.

To describe Event 1 with reference to Event 0, a time difference (delay) $\Delta V_1$ between the two events is defined in an event memory. The timing of Event 2 is defined by a time difference (delay) $\Delta V_2$ from Event 1. Similarly, the timing of Event 3 in FIG. 3E is defined by a time difference (delay) $\Delta V_3$ from Event 2. In the event test system, the timing data in the event memory is read out and summed up to all of the previous events to produce an ultimate timing of the current event.

Therefore, in the example of FIG. 3C, to produce Event 1, the timing relationship of FIG. 3B is used in which $N_1T$ denotes the event count which is $N_1$ times of the reference clock period T and $\Delta_1 T$ denotes the event vernier which is a fraction of the reference clock period T. Similarly to produce Event 3 in FIG. 3E with reference to Event 0, the timing data for all prior events are summed up to produce an overall time difference expressed by $N_3T+\Delta_3T$ wherein $N_3T$ denotes the event count which is $N_3$ times the reference clock period T and $\Delta_3T$ denotes the event vernier which is a fraction of the reference clock period T.

In actual device testing, a test signal for a certain pin of the device under test may not change for a long period of time such as several hundred milliseconds while test signals for most other pins change at much higher rates such as several ten or hundred nanoseconds. This means that the time length between the two adjacent events is in a very wide variety, requiring large bits of data to describe the maximum possible time length. Since a semiconductor test system is a large system having, for example, several hundred test channels (pins), where each test channel includes an event memory, it is desirable to minimize the capacity of the event memory to decrease the overall cost of the test system.

SUMMARY OF THE INVENTION

Therefore, it is an object of the present invention to provide an event based semiconductor test system and event generation method therein for inserting a delay time in timing data of a specified event for enlarging a time difference between two events without affecting the operation of the test system.

It is another object of the present invention to provide an event based semiconductor test system and event generation method therein for producing series of events of various timings wherein an event memory stores the timing data with use of relatively small number of data bits for expressing both long and short time differences between the events.

It is a further object of the present invention to provide an event based semiconductor test system and event generation method therein for producing an event based on a delta time (time difference) from the previous event by storing and modifying the timing data in an event memory of a small memory capacity.

The present invention is an event based test system for testing an electronics device under test (DUT) by producing events of various timings for supplying a test signal to the DUT and evaluating an output of the DUT at a timing of a strobe signal. The timings of the events can be freely changed by changing the timing data in an event memory. Such an event memory has a relatively small capacity and a short word length even, for storing the timing data of a large time difference between two events.

In the present invention, the apparatus for generating test patterns and strobe signals based on event data is comprised of an event memory for storing timing data and event type data of each event wherein the timing data of a current event is expressed by a delay time from an event immediately prior thereto with use of a specified number of data bits, and means for inserting a delay time in the timing data of a specified event in such a way to establish a total delay time of the current event which is longer than that can be expressed by the specified number of data bits in the event memory, wherein the means for inserting the delay time includes means for replicating the timing data and the event type data of the event immediately prior to the specified event.

In another aspect of the present invention, the means for inserting the delay time includes means for inserting a NOP (NO-Operation) event indicating an additional delay time to be added to the specified event and a NOP (NO-Operation) as the event type data, thereby inserting the additional delay time without performing any operations by the test system. The present invention also involves a method of inserting the delay time in the timing data for producing the sequence of events.

In the first and second aspects of the present invention, the timing data in the event memory is comprised of delay count data which is formed with an integer multiple of a reference clock period (integral part data) and delay vernier data which is formed with a fraction of the reference clock period (fractional part data). Further in the first and second aspects of the present invention, such insertion of delay time is repeated multiple of times to attain the desired total delay time of the current event.

A further aspect of the present invention is a method of inserting a delay time in timing data of events to be used for testing semiconductor devices. The method is comprised of the steps of storing timing data and event type data of each event in an event memory wherein the timing data of a current event is expressed by a delay time from an event immediately prior thereto with use of a specified number of data bits, and inserting a delay time in the timing data of a specified event in such a way to establish a total delay time of the current event which is longer than that can be expressed by the specified number of data bits in the event memory. The delay time inserting step is performed by either replicating the timing data and the event type data of the event immediately prior to the specified event or inserting a NOP (NO-Operation) event indicating an additional delay time to be added to the specified event and a NOP (NO-Operation) as the event type data, thereby inserting the additional delay time without performing any operations by the test system.

According to the present invention, the event based semiconductor test system is capable of producing the events of various timings based on the event data stored in the event memory to evaluate the semiconductor device. The timing of each of the events is defined by a difference of time length (delta time) from the last event. The delta time between events can be easily enlarged by inserting a delay time therein in a manner that an overall delta time after the delay time insertion is greater than the maximum word length of the event memory. In one aspect, the delay time insertion operation in the event test system of the present invention is performed by repeating an event immediately prior to the current event until reaching the desired time length. In another aspect, the delay time insertion operation in the event test system is performed by invoking a NOP (no-operation) for the current event until reaching the desired time length.

BRIEF DESCRIPTION OF THE DRAWINGS

FIG. 4 is a timing chart showing timing relationships among various events based on a time difference (delta time) between two adjacent events.

FIG. 5 is a diagram showing an example of data storage in an event memory within the event based test system corresponding to the series of delays shown in FIG. 4 involving no delay time insertion.

FIG. 8 is a diagram showing an example of data storage in an event memory within the event based test system as a first aspect of the present invention for inserting a delay in the timing data in the event memory.

FIG. 10 is a diagram showing an example of data storage in an event memory within the event based test system as a second aspect of the present invention for inserting a delay in the timing data in the event memory.

DETAILED DESCRIPTION OF THE PREFERRED EMBODIMENT

Figure 1:
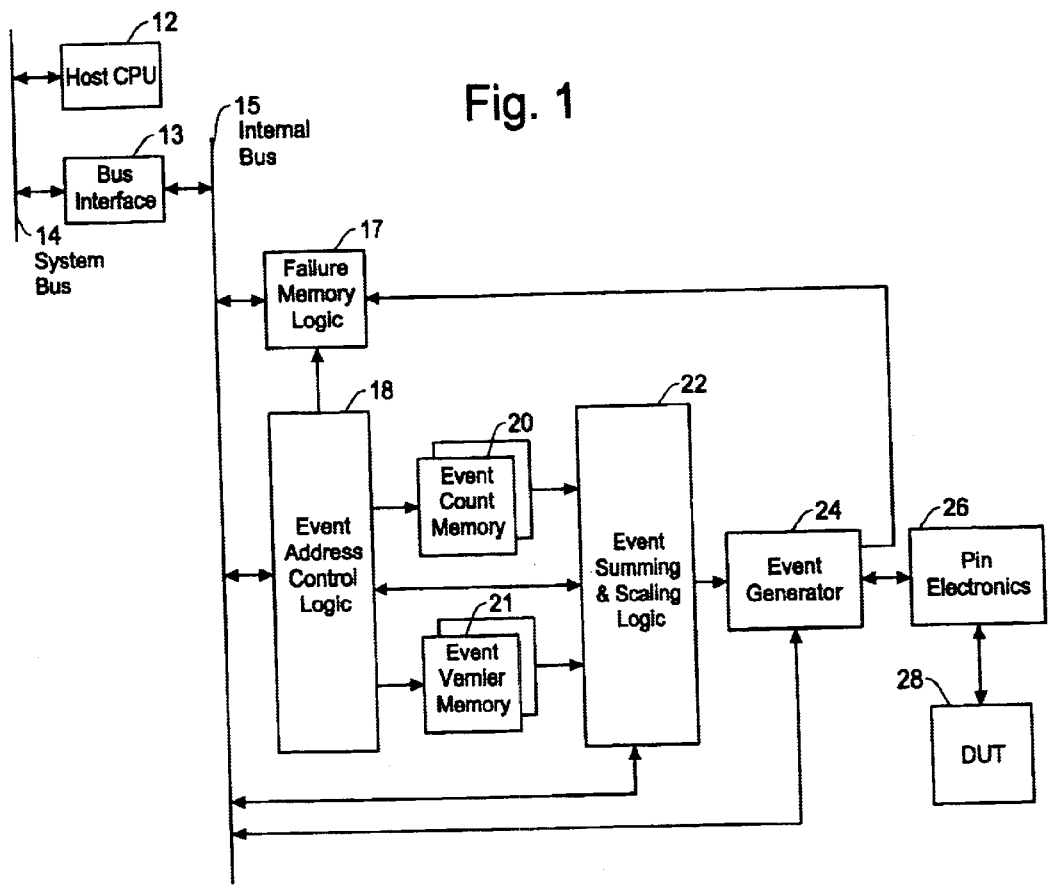
FIG. 1 is a schematic block diagram showing a basic structure of an event based test system of the present invention.

FIG. 1 is a schematic block diagram showing an example of basic structure in an event based test system of the present invention. The event based test system includes a host computer 12 and a bus interface 13 both are connected to a system bus 14, an internal bus 15, an address control logic 18, a failure memory 17, an event memory consists of an event count memory 20 and an event vernier memory 21, an event summing and scaling logic 22, an event generator 24, and a pin electronics 26. The event based test system is to evaluate a semiconductor device under test (DUT) 28, which is typically a memory IC such as a random access memory (RAM) and a flash memory or a logic IC such as a microprocessor and a signal processor, connected to the pin electronics 26.

An example of the host computer 12 is a work station having a UNIX operating system therein. The host computer 12 functions as a user interface to enable a user to instruct the start and stop operation of the test, to load a test program and other test conditions, or to perform test result analysis. The host computer 12 interfaces with a hardware test system through the system bus 14 and the bus interface 13. Although not shown, the host computer 12 is preferably connected to a communication network to send or receive test information from other test systems or computer networks.

The internal bus 15 is a bus in the hardware test system and is commonly connected to most of the functional blocks such as the address control logic 18, failure memory 17, event summing and scaling logic 22, and event generator 24. An example of address control logic 18 is a tester processor which is exclusive to the hardware test system and is not accessible by a user. The address control logic 18 provides instructions to other functional blocks in the test system based, on the test program and conditions from the host computer 12. The failure memory 17 stores test results, such as failure information of the DUT 28, in the addresses defined by the address control logic 18. The information stored in the failure memory 17 is used in the failure analysis stage of the device under test.

The address control logic 18 provides address data to the event count memory 20 and the event vernier memory 21 as shown in FIG. 1. In an actual test system, a plurality of sets of event count memory and event vernier memory will be provided, each set of which may correspond to a test pin of the test system. The event count and vernier memories store the timing data for each event of the test signals and strobe signals. The event count memory 20 stores the timing data which is an integer multiple of the reference clock (integral part), and the event vernier memory 21 stores timing data which is a fraction of the reference clock (fractional part). Within the context of the present invention, the timing data for each event is expressed by a time difference (delay time or delta time) from the previous event.

The event summing and scaling logic 22 is to produce data showing overall timing of each event based on the delta timing data from the event count memory 20 and event vernier memory 21. Basically, such overall timing data is produced by summing the integer multiple data and the fractional data. During the process of summing the timing data, a carry over operation of the fractional data (offset to the integer data) is also conducted in the timing count and offset logic 22. Further during the process of producing the overall timing, timing data may be multiplied by a scaling factor so that the overall timing be modified accordingly.

The event generator 24 is to actually generate the events based on the overall timing data from the event summing and scaling logic 22. The events (test signals and strobe signals) thus generated are provided to the DUT 28 through the pin electronics 26. Basically, the pin electronics 26 is formed of a large number of components, each of which includes a driver and a comparator as well as switches to establish input and output relationships with respect to the DUT 28.

Figure 2:
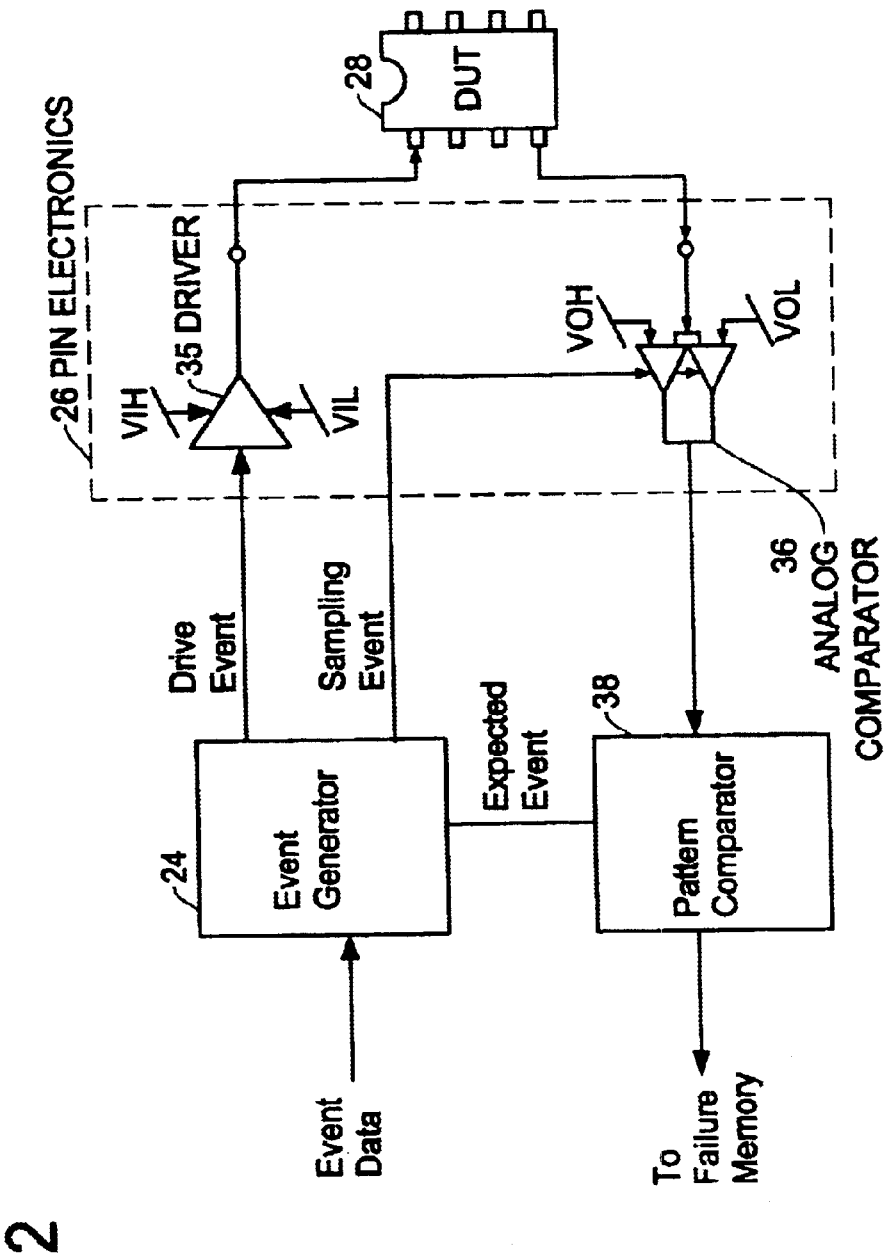
FIG. 2 is a block diagram showing a more detailed structure concerning the pin electronics of FIG. 1 and associated drive events (test signal) and sampling event (strobe signal) from the event generator.

FIG. 2 is a block diagram showing a more detailed structure in the pin electronics 26 having a driver 35 and an analog comparator 36. The event generator 24 produces drive events which are provided to an input pin of the DUT 28 as a test signal through the driver 35. The event generator 24 further produces a sampling event which is provided to the analog comparator 36 as a strobe signal for sampling an output signal of the DUT 28. The output signal of the analog comparator 36 is compared with the expected data from the event generator 24 by a pattern comparator 38. If there is a mismatch between the two, a failure signal is sent to the failure memory 17 in FIG. 1.

Figure 3A:
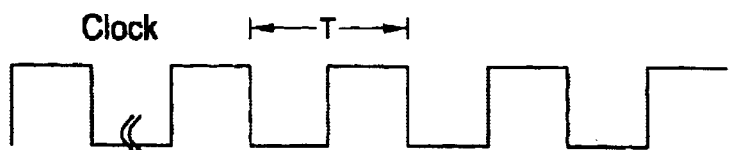
FIG. 3 is a timing chart showing timing relationships among various events including the drive event and sampling event relative to a reference clock for showing the basic concept of an event based test operation.
Figure 3B:
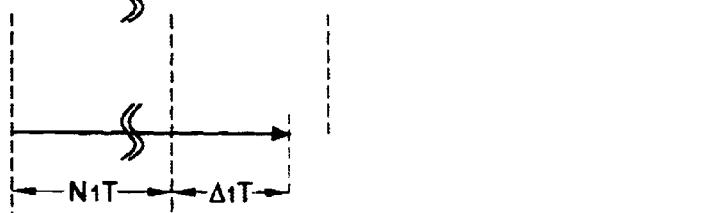
Figure 3C:
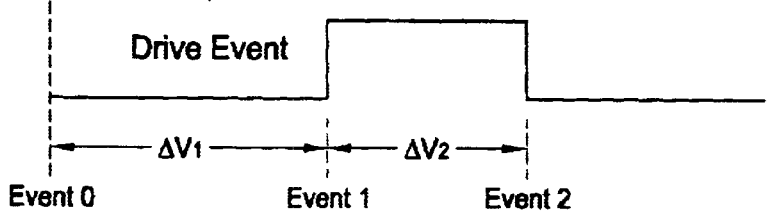
Figure 3D:
Figure 3E:
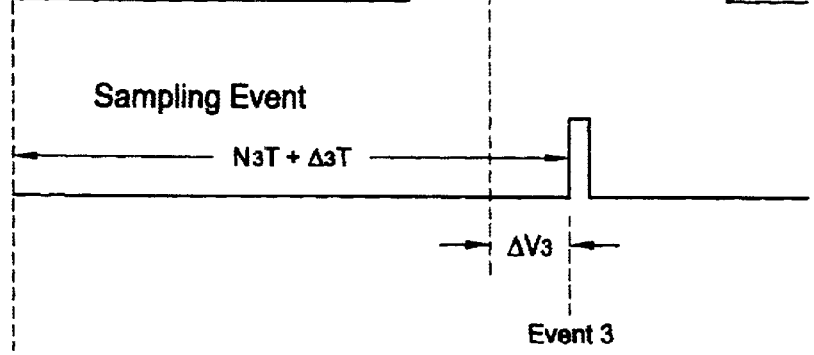

An example of waveforms of the drive events (test pattern), output signal from the DUT, and sampling event (strobe signal) is shown in FIGS. 3C, 3D and 3E, respectively. When applying the drive events of FIG. 3C to the DUT 28 through the driver 35, in response thereto, the DUT 28 produces the output signal shown in FIG. 3D which is strobed by the timing determined by the sampling event of FIG. 3E. As shown in FIG. 3C, the drive events determine the timings of the rising and falling edges of the test pattern. In contrast, as shown in FIG. 3E, the sampling event determines the timing of the strobe point, i.e., a strobe signal can be produced only by a single event when such an event is indicated as a sampling event. This is because a strobe signal has a very narrow pulse width so that it is not practically possible to produce a strobe signal by defining both rising and falling edges thereof.

FIG. 4 is a timing chart showing timing relationships among various events based on a time difference (delta time) between two adjacent events. As noted above with reference to FIGS. 3A–3E, the time length (delay value) between the events is defined by a combination of an integer multiple of a reference clock period (integer part or delay count) and a fraction of the reference clock period (fractional part or delay vernier).

In the example of FIG. 4, Events 0–7 are expressed with reference to the reference clock having a time interval T=1. For example, a delta (delay) time $\Delta V_0$ for Event 0 may be 0.75 (delay count "0", and delay vernier "0.75"), and a delta time $\Delta V_1$ for Event 1 may be 1.50 (delay count "1", and delay vernier "0.50"). In this situation, the total delay of Event 1 will be 2.25 where a logic in the test system counts two event clocks "2.0" and calculates sum of delay vernier "0.25" as the remaining fractional delay.

Figure 6:
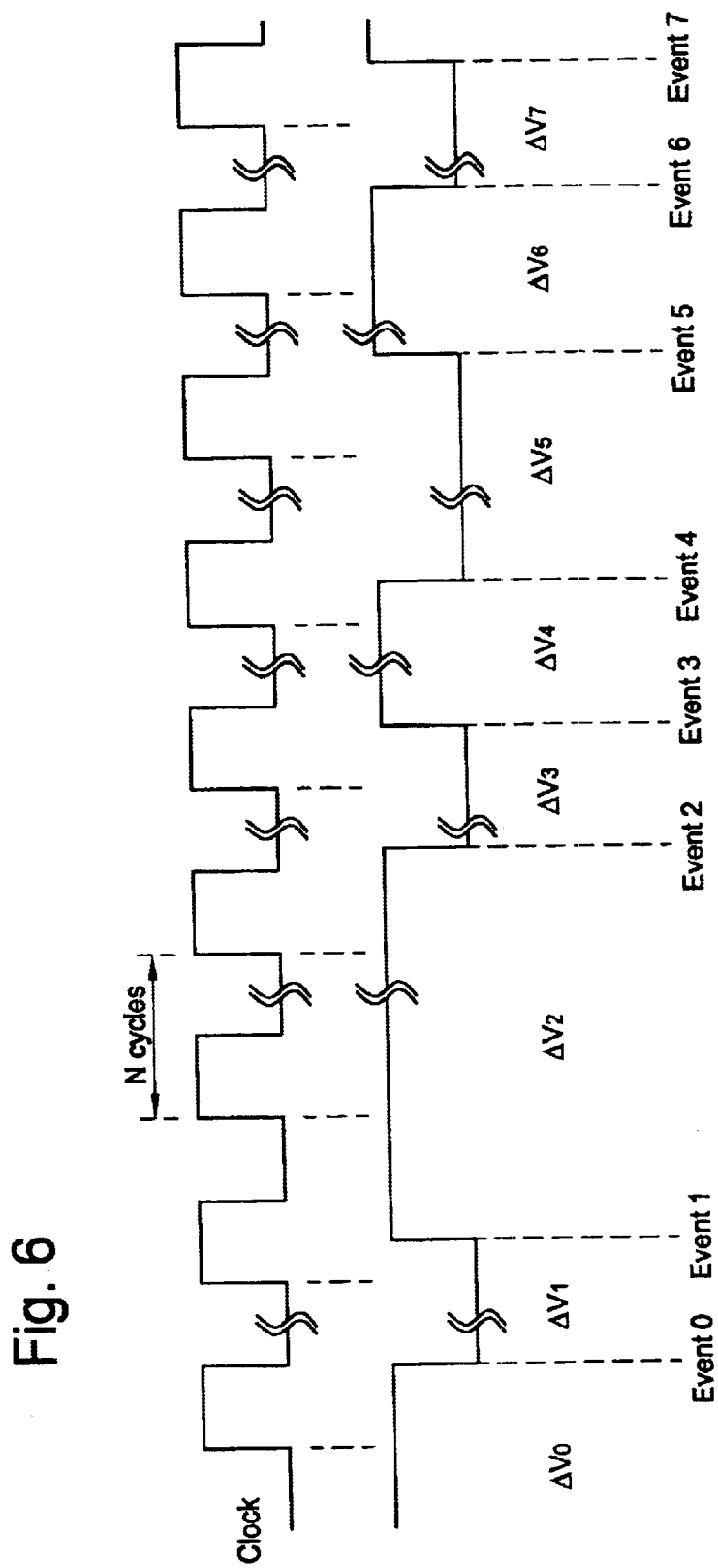
FIG. 6 is a timing chart showing an example of waveforms of the series of events generated based on the timing data stored in the event memory of FIG. 5 involving no delay time insertion.

FIG. 5 is a diagram showing an example of data storage in an event memory within the event based test system corresponding to the series of delays shown in FIG. 4. The delay time $\Delta V_n$ ($\Delta V_0$, $\Delta V_1$, $\Delta V_2$ ...) is expressed by the combination of delay count Cn (C1, C2, C3, ...) and delay vernier Vn (V1, V2, V3, ...) as shown in FIG. 5. FIG. 6 is a timing chart showing an example of waveforms of the series of events generated based on the timing data stored in the event memory of FIG. 5. The example of FIGS. 5 and 6 does not involve delay time insertion.

Because the delay vernier is always less than the reference clock period T, a word length of several bits may be sufficient to fully describe any fractional delays of the events. However, the event count data (delay count) has to support a wide range of integer values such as from 1 to 134,217,728 reference clock periods. This is because the time length between the two events in an actual test operation can be as small as several ten nanoseconds to as large as several hundred milliseconds. Such a large number of clock periods requires a total of 27 data bits for each delay count data in the event memory.

In actual device tests, it is rare to actually use such a large number of clock periods, and substantially smaller number of clock periods are sufficient in most occasions. Thus, it is desirable to use a much smaller bit length, such as nine bits, for the delay count data in the event memory. Therefore, the present invention is to provide a method of inserting a delay time in the events so that the delay data involving a large number of clock periods can be obtained with use of a relatively small number of data bits. In other words, the present invention is to achieve means for generating an event whose time difference from the previous event is much longer than that being able to describe by the assigned data bits in the event memory.

Figure 7:
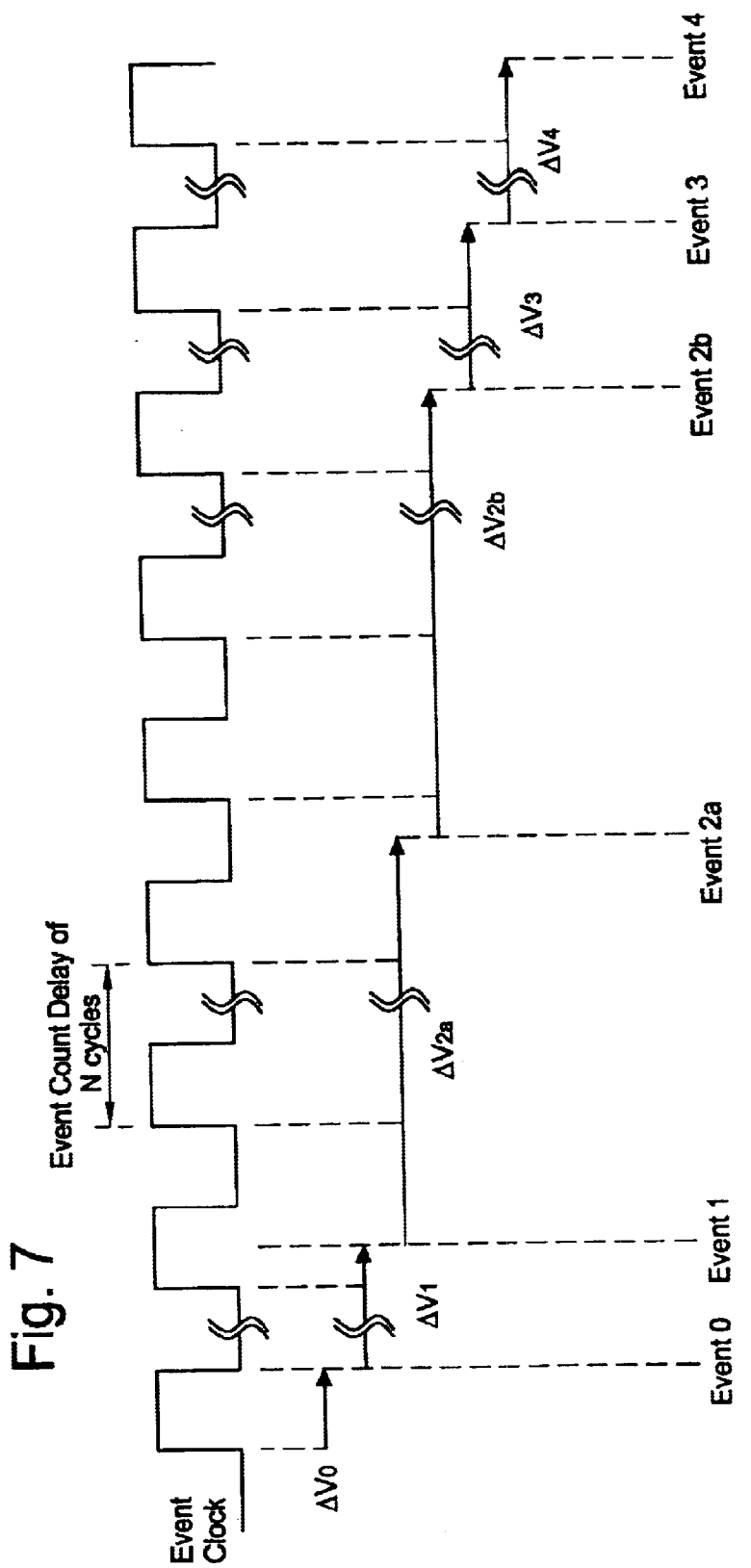
FIG. 7 is a timing chart showing an example of timing relationship in a situation where an additional event is inserted in the event sequence to attain a long enough delay between the events.

Assuming that the delay value $\Delta V_2$ in FIGS. 4 and 5 for producing Event 2 does not have a long enough delay, an additional delay time has to be inserted in the existing delay data to attain the intended delay time. A timing chart of FIG. 7 shows such a situation where an additional event is inserted in the event sequence to produce a long enough delay between Event 1 and Event 2. In the example of FIG. 7, Event 2 is broken into two events, i.e., Event 2a having a delay time $\Delta V_{2a}$ and Event 2b having a delay time $\Delta V_{2b}$. In other words, Event 2a having the maximum delay time is inserted in the Event 2.

Figure 9:
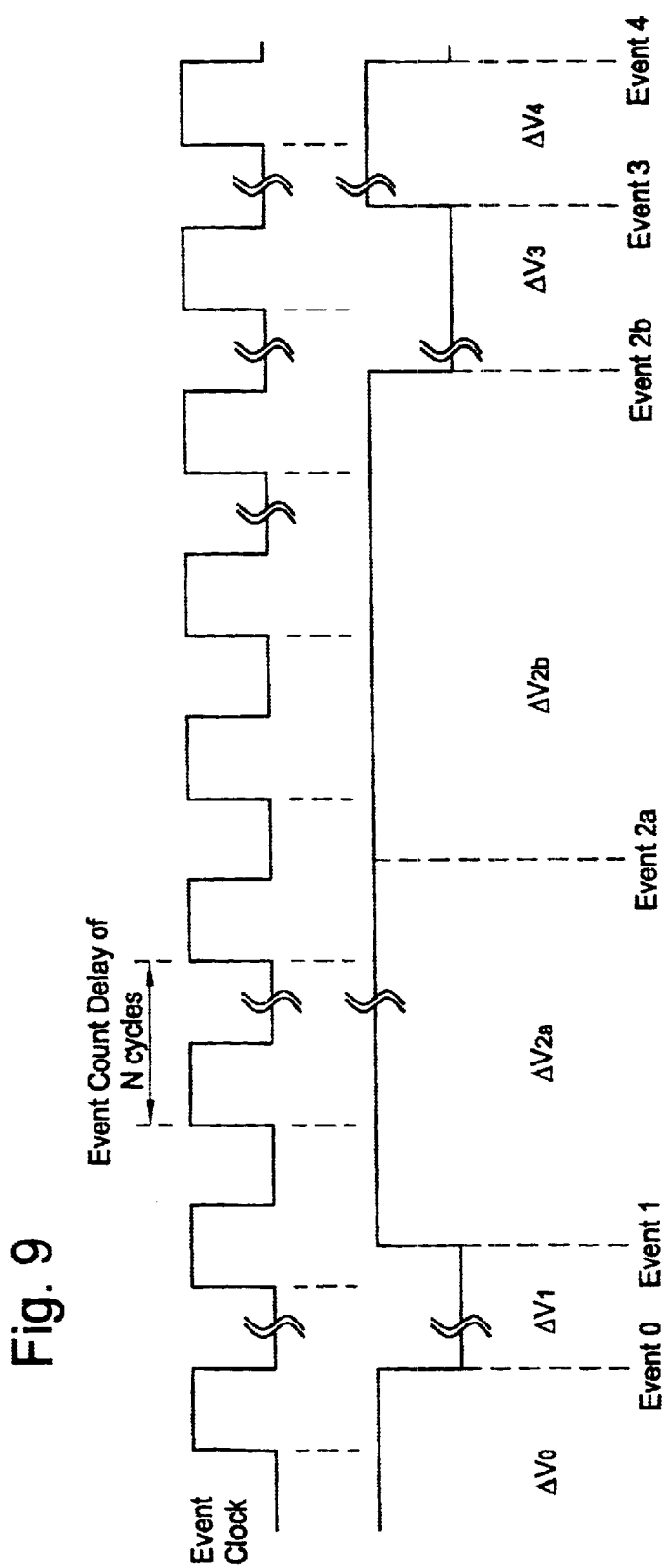
FIG. 9 is a timing chart showing an example of waveforms of the series of events generated based on the timing data stored in the event memory of FIG. 8 in the first aspect of the present invention.

In the first aspect of the invention, an operation of such delay insertion is performed by replicating a previous event, i.e., Event 1. An example of data storage in the event memory is shown in FIG. 8 in which Event 2a having the maximum delay count data and zero vernier data is inserted therein. Event 2a is an event type same as that of Event 1 as shown in the rightmost column of FIG. 8. The event data of FIG. 8 would be translated to the waveform in FIG. 9. Event 2 is created by the combination of Event 2a having the delay time $\Delta V_{2a}$ (maximum delay count and delay vernier 0) and Event 2b having the delay time $\Delta V_{2b}$ (delay count C2 and delay vernier V2). In other words, the output status "High" created by Event 1 is kept as is by successively generating Event 2a which has the same type as the type, "Drive Logical High" of Event 1. Although the delay count of Event 2a in the above example is the maximum, the delay count data may vary depending on the delay time to be inserted and thus can be smaller than the maximum. Alternatively, when the desired time length requires addition of more than two maximum delay count, Event 1 having the maximum delay count will be replicated multiple of times.

The solution in the first aspect of the present invention is effective in the stream of drive events for producing the test pattern such as shown in FIG. 3C. However, this solution presents a problem in generating the sampling events (strobe signals). As briefly noted in the foregoing, a strobe signal is a very narrow pulse which is defined by a single edge or event rather than two edges such as set (rising) and reset (falling) edges. Thus, in the case where Event 1 is a sampling event (strobe), a strobe signal will be generated in the example of FIG. 9 at an intermediate point of event such as a timing indicated by Event 2a therein. Such a strobe signal is provided to the analog comparator as shown in FIG. 2 to sample the output signal of the DUT. The sampled output is logically compared with the expected data, the result may be a failure where no sampling was intended, although there is no failure in the operation of the DUT.

Figure 11:
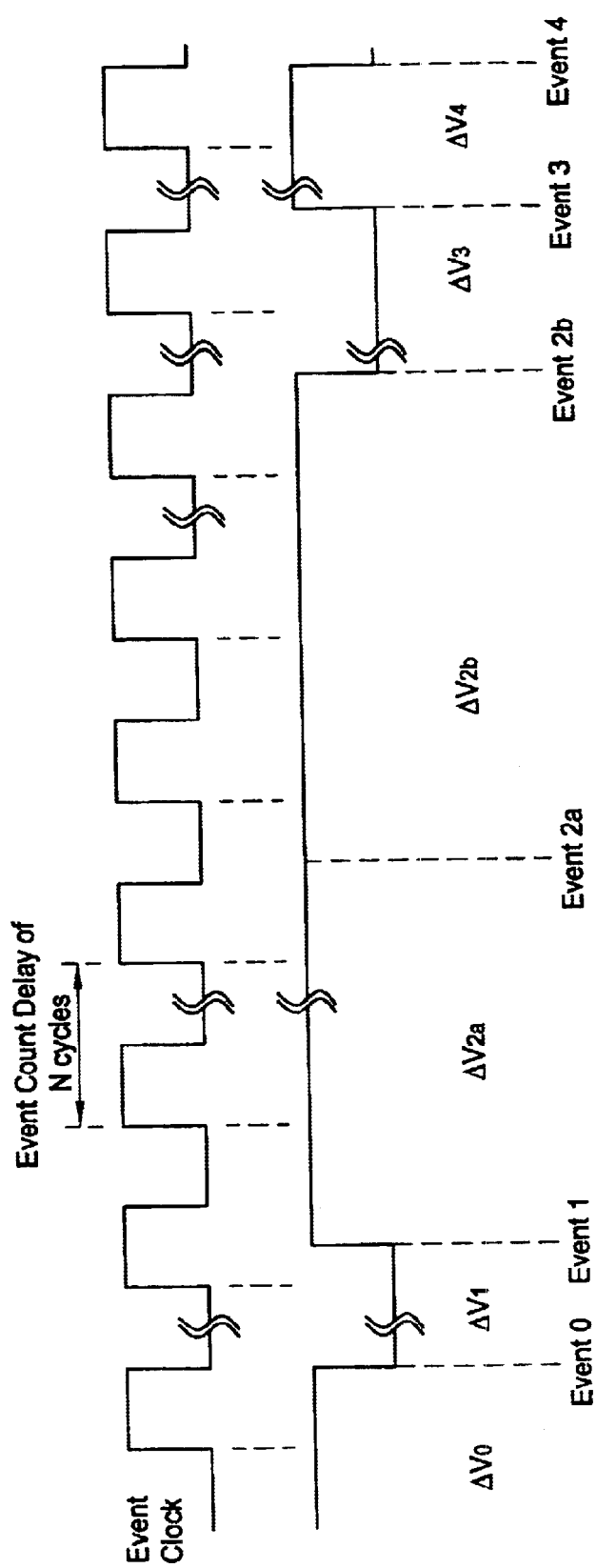
FIG. 11 is a timing chart showing an example of waveforms of the series of events generated based on the timing data stored in the event memory of FIG. 9 in the second aspect of the present invention.

Therefore, a second aspect of the present invention is an alternative solution to the first one presented above where a new event called NOP (NO-Operation) is inserted in the event memory. FIG. 10 shows the data storage in the event memory in the second aspect of the present invention. A NOP event indicated as Event 2a is inserted in the event data after Event 1. Event 2a has the delay time $\Delta V_{2a}$ (maximum delay count and delay vernier 0). An event type of the new event is indicated as NOP in the rightmost column of FIG. 10. The event data of FIG. 10 would be translated to the waveform in FIG. 11.

When the NOP event is invoked, the test system does nothing in the operation other than producing a delay time indicated. Thus, for drive events, the NOP insertion would not change the state of the test pin. For sequence of sampling events, the NOP insertion would produce no sampling events, and accordingly, no incorrect test results. Although the delay count of Event 2a in the above example is the maximum, the delay count data may vary depending on the delay time to be inserted and thus can be smaller than the maximum. Further, when the desired time length requires more than two NOP events, multiple of NOP events each having the maximum delay count may be inserted.

According to the present invention, the event based semiconductor test system is capable of producing the events of various timings based on the event data stored in the event memory to evaluate the semiconductor device. The timing of each of the events is defined by a difference of time length (delta time) from the last event. The delta time between events can be easily enlarged by inserting a delay time therein in a manner that an overall delta time after the delay time insertion is greater than the maximum word length of the event memory. In one aspect, the delay time insertion operation in the event test system of the present invention is performed by repeating an event immediately prior to the current event until reaching the desired time length. In another aspect, the delay time insertion operation in the event test system is performed by invoking the NOP (NO-Operation) for the current event until reaching the desired time length.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. An apparatus for generating test patterns and strobe signals based on event data in a semiconductor test system, comprising:

an event memory for storing timing data and event type data of each event wherein the timing data of a current event is expressed by a delay time from an event immediately prior thereto with use of a specified number of data bits; and means for successively generating an event with the same type as that of the immediate prior event to keep the same output status as the output status set by the immediate prior event, thereby establishing a total delay time of the current event which is longer than that can be expressed by the specified number of data bits in the event memory;

wherein the means for successively generating the event includes means for specifying an arbitrary delay time with use of the specified number of data bits.

2. An apparatus for generating test patterns and strobe signals as defined in claim 1, wherein the timing data in the event memory is comprised of delay count data which is formed with an integer multiple of a reference clock period and delay vernier data which is formed with a fraction of the reference clock period.

3. An apparatus for generating test patterns and strobe signals as defined in claim 1, wherein a process of said successively generating an event with the same type as that of the immediate prior event is repeated multiple of times to keep the same output status as the output status set by the immediate prior event.

4. An apparatus for generating test patterns and strobe signals based on event data in a semiconductor test system, comprising:

an event memory for storing timing data and event type data of each event wherein the timing data of a current event is expressed by a delay time from an event immediately prior thereto with use of a specified number of data bits; and means for successively generating an event labeled by a (NO-Operation) with the same type as that of the immediate prior event to keep the output status set by the immediate prior event as is, thereby establishing a total delay time of the current event which is longer than that can be expressed by the specified number of data bits in the event memory;

wherein the means for successively generating the event labeled with the NO-Operation includes means for inhibiting any other operations than the operation of keeping the output status set by the immediate prior event as is.

5. An apparatus for generating test patterns and strobe signals as defined in claim 4, wherein the timing data in the event memory is comprised of delay count data which is formed with an integer multiple of a reference clock period and delay vernier data which is formed with a fraction of the reference clock period.

6. An apparatus for generating test patterns and strobe signals as defined in claim 4, wherein the event labeled by the NO with the same type as that of the immediately prior event is repeated multiple of times to keep the output status set by the immediate prior event as is.

7. A method of inserting a delay time in timing data of events to be used for testing semiconductor devices, comprising the steps of:

storing timing data and event type data of each event in an event memory wherein the timing data of a current event is expressed by a delay time from an event immediately prior thereto with use of a specified number of data bits; and successively generating an event labeled by a (NO-Operation) with the same type as that of the immediate prior event to keep the output status set by the immediate prior event as is, thereby establishing a total delay time of the current event which is longer than that can be expressed by the specified number of data bits in the event memory;

wherein the means for successive generating the event labeled with the NO-Operation includes means for inhibiting any other operations than the operation of keeping the output status set by the immediate prior event as is.

8. A method of inserting a delay time in timing data as defined in claim 7, wherein the timing data in the event memory is comprised of delay count data which is formed with an integer multiple of a reference clock period and delay vernier data which is formed with a fraction of the reference clock period.

* * * * *